(12) United States Patent
Agostinelli et al.

(10) Patent No.: US 10,971,062 B2
(45) Date of Patent: Apr. 6, 2021

(54) CONTROL COMPONENT FOR A CURRENT-DRIVEN OPTICAL MEDIA

(71) Applicant: Flexenable Limited, Cambridge (GB)

(72) Inventors: Tiziano Agostinelli, Cambridge (GB); Burag Yaglioglu, Cambridge (GB)

(73) Assignee: Flexenable Limited, Cambridge (GB)

( * ) Notice: Subject to any disclaimer, the term of this patent is extended or adjusted under 35 U.S.C. 154(b) by 19 days.

(21) Appl. No.: 15/567,494

(22) PCT Filed: Apr. 22, 2016

(86) PCT No.: PCT/GB2016/051125
§ 371 (c)(1),
(2) Date: Oct. 18, 2017

(87) PCT Pub. No.: WO2016/170355
PCT Pub. Date: Oct. 27, 2016

(65) Prior Publication Data
US 2018/0158405 A1    Jun. 7, 2018

(30) Foreign Application Priority Data

Apr. 22, 2015   (GB) .................................. 1506878

(51) Int. Cl.
*G09G 3/3233*   (2016.01)
*H01L 27/12*    (2006.01)

(52) U.S. Cl.
CPC ......... *G09G 3/3233* (2013.01); *H01L 27/124* (2013.01); *H01L 27/1218* (2013.01);
(Continued)

(58) Field of Classification Search
CPC ............ G09G 3/3233; G09G 2380/02; G09G 2300/0852; G09G 2300/0426; H01L 27/1218; H01L 27/1255; H01L 27/124
See application file for complete search history.

(56) References Cited

U.S. PATENT DOCUMENTS

2003/0117059 A1   6/2003  Koo et al.
2003/0214248 A1   11/2003 Jinno
(Continued)

FOREIGN PATENT DOCUMENTS

EP    0999595 A2    5/2000
EP    1727207 A2    11/2006
(Continued)

OTHER PUBLICATIONS

Search Report dated Sep. 18, 2015 in corresponding GB Application No. GB1506878.6.
(Continued)

*Primary Examiner* — Amit Chatly
(74) *Attorney, Agent, or Firm* — Knobbe, Martens, Olson & Bear LLP

(57) ABSTRACT

A control component for a current-driven optical media is provided. The control component includes thin film transistors (TFT) for driving pixels of an active matrix optoelectronic device. An additional electrode is provided in a separate conducting layer within the control component in order to add a separate capacitance ($C_2$) that is coupled to the gate electrode of the control component to supplement the capacitance ($C_1$) already coupled between the gate and source electrodes.

21 Claims, 8 Drawing Sheets

(52) U.S. Cl.
CPC . *H01L 27/1255* (2013.01); *G09G 2300/0426* (2013.01); *G09G 2300/0852* (2013.01); *G09G 2380/02* (2013.01)

(56) References Cited

U.S. PATENT DOCUMENTS

| | | | |
|---|---|---|---|
| 2006/0119753 A1* | 6/2006 | Luo | G02F 1/136213 349/38 |
| 2007/0064164 A1 | 3/2007 | Tasaka et al. | |
| 2008/0048562 A1* | 2/2008 | Matsuda | H01L 27/3244 313/506 |
| 2008/0296581 A1* | 12/2008 | Chao | G02F 1/136213 257/71 |
| 2009/0115950 A1 | 5/2009 | Toyota et al. | |
| 2009/0309516 A1* | 12/2009 | Kim | G09G 3/3233 315/307 |
| 2011/0079787 A1 | 4/2011 | Choi | |
| 2011/0164023 A1 | 7/2011 | Ko | |
| 2013/0075766 A1* | 3/2013 | Chang | H01L 27/1255 257/88 |
| 2013/0140537 A1* | 6/2013 | Ha | H01L 27/3262 257/40 |
| 2013/0176195 A1* | 7/2013 | Kim | H01L 27/3262 345/80 |
| 2014/0158995 A1 | 6/2014 | Park | |
| 2014/0320476 A1 | 10/2014 | Choi et al. | |
| 2015/0060845 A1 | 3/2015 | Shishido | |

FOREIGN PATENT DOCUMENTS

| | | |
|---|---|---|
| EP | 2136352 A1 | 12/2009 |
| EP | 2214211 A2 | 8/2010 |
| EP | 2525405 A2 | 11/2012 |

OTHER PUBLICATIONS

International Search Report dated Oct. 12, 2016 regarding corresponding International Application No. PCT/GB2016/051125.
Written Opinion of the International Searching Authority dated Oct. 12, 2016 regarding corresponding International Application No. PCT/GB2016/051125.

* cited by examiner

CONTROL COMPONENT FOR A CURRENT-DRIVEN OPTICAL MEDIA

CROSS-REFERENCE TO RELATED APPLICATIONS

This application is the U.S. National Phase under 35 U.S.C. § 371 of International Application No. PCT/GB2016/051125, filed Apr. 22, 2016, designating the United States and published in English on Oct. 27, 2016, as WO 2016/170355, which claims priority to United Kingdom Application No. 1506878.6, filed Apr. 22, 2015.

FIELD OF THE INVENTION

The present invention relates to a control component for a current-driven optical media, for example a multilayer electronic structure control component including thin film transistors (TFT) for driving pixels of an active matrix optoelectronic device.

BACKGROUND OF THE INVENTION

High resolution AMOLED displays are normally processed using glass as a substrate, on which are deposited a plurality of transistor structures for driving pixel electrodes. Common transistor structures are schematically shown in FIGS. 1 and 2 (not in scale): FIG. 1 shows a top-gate configuration; FIG. 2 shows a bottom gate configuration. Each of FIGS. 1 and 2 show the transistors in a 2T1C (two transistors, 1 capacitor) structure for driving a pixel electrode (although other structures are also possible). The rightmost via that connects to the pixel electrode can also be achieved by etching the underlying dielectric layers before metallization, so that ML3 would merge with ML1.

In FIG. 1, the first transistor (5) comprises a source electrode (2) and a drain electrode (3) in a first conducting layer (ML1). A gate electrode (4) resides in the second conducting layer (ML2). ML1 and ML2 are separated by one or more dielectric or semiconducting layers. Conducting layers are normally patterned in such a way that conductive islands are formed, optionally connected by vias or other means at different levels, thus creating electronic devices and circuits with the desired functionality.

A second transistor (9) comprises a source (6) and drain (7) electrode in the first conducting layer (ML1), and a gate (8) electrode in the second conducting layer (ML2). The drain electrode (3) of the first transistor (5) is connected to the gate electrode (8) of the second transistor (5) using a via between the conducting layers ML1 and ML2. The drain electrode (7) of the second transistor (9) is connected to a pixel electrode (10) in a third conducting layer (ML3) using a via between the conducting layers ML1 and ML3.

A storage capacitance results from the overlap of the second gate electrode (8) and the source electrode (6), which are separated by one or more dielectric layers. This is often desired, as a storage capacitance between the gate and source electrodes enables the voltage of the gate electrode to remain at the desired value.

FIG. 2 shows an alternative configuration for the control component, which is a bottom-gate configuration.

In FIG. 2, the first transistor (5) comprises a source electrode (2) and a drain electrode (3) in a second conducting layer (ML2). A gate electrode (4) resides in the first conducting layer (ML1). ML1 and ML2 are separated by one or more dielectric or semiconducting layers.

A second transistor (9) comprises a source (6) and drain (7) electrode in the second conducting layer (ML2), and a gate (8) electrode in the first conducting layer (ML1). The drain electrode (3) of the first transistor (5) is connected to the gate electrode (8) of the second transistor (5) using a via between the conducting layers ML1 and ML2. The drain electrode (7) of the second transistor (9) is connected to a pixel electrode (10) in a fourth conducting layer (ML4) using a via between the conducting layers ML1 and ML4. FIG. 2 also shows an optional shield electrode (11), which resides in the third conducting layer (ML3) over the gap between the source (6) and drain (7) electrodes. This is optional, but is there to prevent light penetrating from the display surface into the second transistor (9).

A storage capacitance results from the overlap of the second gate electrode (8) and the source electrode (6), which are separated by one or more dielectric layers. This is often desired, as a storage capacitance between the gate and source electrodes enables the voltage of the gate electrode to remain at the desired value.

High storage capacitances with small area occupation are possible on non-flexible substrates such as glass thanks to the high capacitance per unit area achievable with non-flexible inorganic dielectrics. That is, structures can be made finer, and layers thinner, because of the stability of the non-flexible structures during the manufacturing process. Thinner dielectric layers result in higher capacitances per unit area. Higher pixel densities can therefore be more easily achieved.

However, high capacitances per area are not as easily manufacturable when flexible substrates and flexible dielectrics for flexible AMOLED displays are used. Flexible dielectrics do not always have high dielectric constants and are not always processable to form thin layers. As such, the pixel density of flexible displays can be affected to allow for storage capacitors with larger area in order to compensate for the reduced achievable capacitance per unit area.

We have therefore appreciated the need for a multiple layer electronic structures for use in flexible displays that have an increased storage capacitance.

SUMMARY OF THE INVENTION

The present invention therefore provides a control component for controlling a current-driven optical media, the control component comprising a thin film transistor (TFT) for driving a pixel of an active matrix optoelectronic device, the control component comprising: a substrate bearing a plurality of conducting layers, each being separated by respective dielectric and/or semiconducting layers, to define a plurality of TFTs and plurality of pixel electrodes, each of the plurality of pixel electrodes being electrically connected to at least one of the plurality of TFTs; for each TFT: first and second ones of the conducting layers defining source/drain electrodes and a gate electrode, the source/drain and gate electrodes being arranged such that a first storage capacitor ($C_1$) is defined between the source and gate electrode, and the drain electrode is connected to a respective pixel electrode; third one of the conducting layers arranged to more strongly capacitively couple to the source or gate electrode than the pixel electrode or the semiconductor channel, wherein a first plate of a second capacitor ($C_2$) is defined by the third one of the conducting layers, and a second plate of the second capacitor ($C_2$) is defined by the gate electrode or the source electrode, the second capacitor ($C_2$) providing an additional storage capacitance to the gate electrode.

With this arrangement, the additional capacitance on the gate electrode enables the voltage of the gate electrode to remain at the desired value.

When the TFT is a top gate configuration TFT, the source/drain electrodes may be in the first one of the conducting layers, and wherein the gate electrode is in the second conducting layer which is a layer above the first layer separated by a dielectric layer.

When the TFT is a top gate configuration TFT, the second plate of the second capacitor may be defined by the gate electrode, wherein the third conducting layer is above the second conducting layer and separated by a dielectric layer, and wherein the first plate of the second capacitor in the third conducting layer is above the gate electrode to define the second capacitor coupled to the gate electrode. The first plate of the second capacitor may be connected to the source electrode by a via.

This arrangement may comprise a controllable switching element between the first plate of the second capacitor and the source electrode, the controllable switching element being arranged to controllably connect the first plate to the source or disconnect the first plate from the source.

The via between the second plate of the capacitor and the source electrode may located outside of an area comprising the plurality of pixel electrodes. The via between the second plate of the capacitor and the source electrode may also or alternatively be located within the structure of the TFT.

The first plate of the second capacitor may be connected to a secondary voltage source. In this arrangement, a controllable switching element may be provided between the first plate of the second capacitor and the secondary voltage source, the controllable switching element being arranged to controllably connect the first plate to the secondary voltage source or disconnect the first plate from the secondary voltage source.

The third conducting layer may comprise a plurality of first plates of the second capacitors, one for each TFT, and wherein the plurality of first plates of the second capacitors are arranged as an interconnected grid over the width and length of the first and second layers of the plurality of TFTs, and wherein the holes in the grid are arranged to permit vias to pass therethrough from layers below the third layer to layers above the third layer. The connection bus may be provided outside of an area comprising the plurality of pixel electrodes, and wherein the plurality of first plates of the second capacitors are connected to the connection bus.

In an alternative arrangement of the top gate configuration, the second plate of the second capacitor may be defined by the source electrode, wherein the third conducting layer is a layer below the first conducting layer and separated by a dielectric layer, wherein the first plate of the second capacitor in the third conducting layer is disposed below the source electrode and is connected to the gate electrode to define the second capacitor coupled to the gate electrode. In this arrangement, the first plate of the second capacitor may be connected to the gate electrode by a via.

When the TFT is a bottom gate configuration TFT, the gate electrode may be in the first one of the conducting layers, wherein the source/drain electrodes are in the second conducting layer which is a layer above the first layer separated by a dielectric layer.

For the bottom gate configuration, the second plate of the second capacitor is defined by the gate electrode, wherein the third conducting layer is below the first conducting layer and separated by a dielectric layer, and wherein the first plate of the second capacitor in the third conducting layer is below the gate electrode to define the second capacitor coupled to the gate electrode. The first plate of the second capacitor may be connected to the source electrode by a via.

For the bottom gate configuration, the control component may comprise a controllable switching element between the first plate of the second capacitor and the source electrode, the controllable switching element being arranged to controllably connect the first plate to the source or disconnect the first plate from the source.

For the bottom gate configuration, the via between the second plate of the capacitor and the source electrode may be located outside of an area comprising the plurality of pixel electrodes. The via between the second plate of the capacitor and the source electrode may also or alternatively be located within the structure of the TFT.

For the bottom gate configuration, the first plate of the second capacitor may be connected to a secondary voltage source.

For the bottom gate configuration, the control component may comprise a controllable switching element between the first plate of the second capacitor and the secondary voltage source, the controllable switching element being arranged to controllably connect the first plate to the secondary voltage source or disconnect the first plate from the secondary voltage source.

For the bottom gate configuration, the third conducting layer may comprise a plurality of first plates of the second capacitors, one for each TFT, and wherein the plurality of first plates of the second capacitors are arranged as an interconnected grid over the width and length of the first and second layers of the plurality of TFTs.

For the bottom gate configuration, a connection bus may be provided outside of an area comprising the plurality of pixel electrodes, and wherein the plurality of first plates of the second capacitors are connected to the connection bus.

For the bottom gate configuration, the second plate of the second capacitor is defined by the source electrode, wherein the third conducting layer is a layer above the second conducting layer and separated by a dielectric layer, wherein the first plate of the second capacitor in the third conducting layer is disposed above the source electrode and is connected to the gate electrode to define the second capacitor coupled to the gate electrode. The first plate of the second capacitor may be connected to the gate electrode by a via.

An any of the configurations above, each of the plurality of TFTs may be connected to a respective second TFT, wherein a drain of the second TFT is connected to the gate electrode of the TFT such that each of the TFT and second TFT are in a 2T1C configuration for driving the pixel electrode.

LIST OF FIGURES

The present invention will now be described, by way of example only, with reference to the accompanying figures, in which:

FIG. 8b shows via connection configurations for FIG. 7a;

DETAILED DESCRIPTION OF THE PREFERRED EMBODIMENTS

In brief, embodiments of the present invention use an additional electrode (31) in a separate conducting layer in order to provide extra capacitive coupling with the gate electrode (28) of the control component to supplement the capacitive coupling ($C_1$) already present between the gate electrode (28) and the source electrode S2. The extra capacitive coupling ($C_2$) is provided by an electrode in a separate conducting layer overlapping with the gate electrode (28). The electrode in the separate conducting layer may be conductively connected to the same voltage source as the source electrode S2 and by connections (e.g. vias) within the multilayer structure, or may be connected to a different voltage source to the source electrode S2. Alternatively, the extra capacitive coupling ($C_2$) may be provided by conductively connecting the gate electrode within the multilayer structure of the control component to an electrode in a separate conducting layer and overlapping with the source electrode. The above additional capacitive coupling ($C_2$) is possible with top-gate and bottom-gate configurations, as will be described below.

Figure 3:
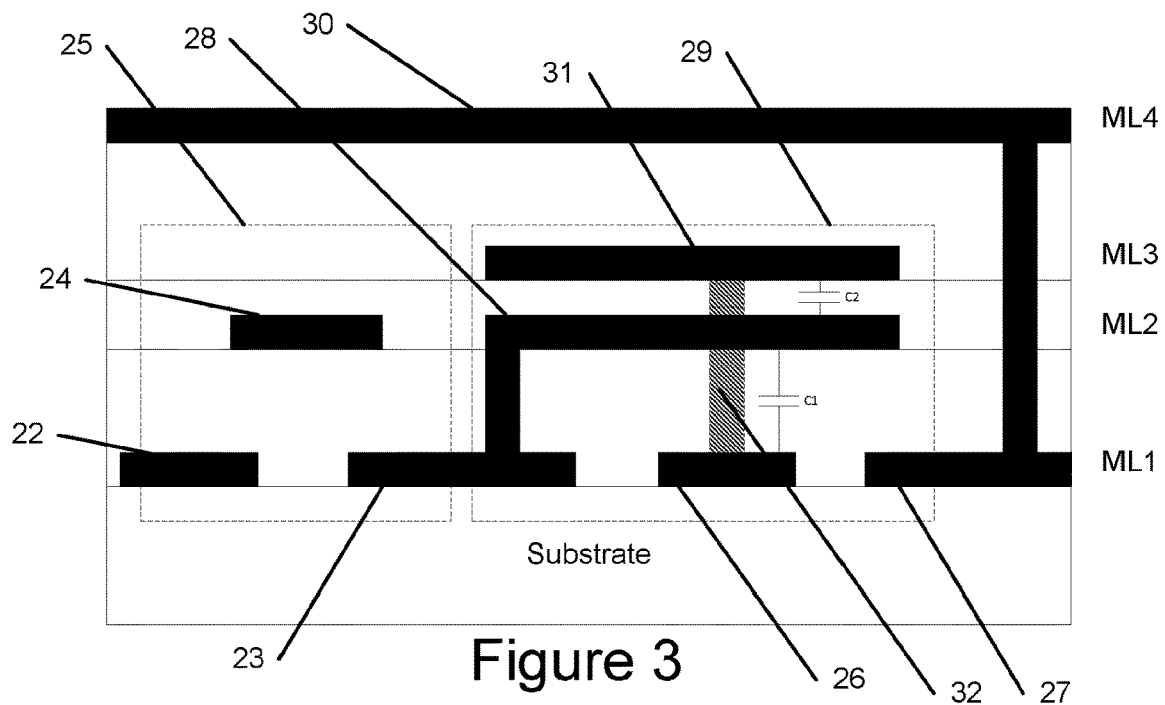
FIG. 3 shows a top-gate configuration control component.

FIG. 3 shows a top-gate configuration multiple layer electronic structure for a control component including Thin Film Transistors (TFTs) for driving a pixel electrode in a display (for example an AMOLED display). FIG. 3 only shows one pixel in a display which comprises many pixels having the same arrangement. Whilst the figures show the TFTs in a 2T1C arrangement, the invention is not limited to 2T1C configurations. The invention more generally applied to drive transistors, which in the case of a 2T1C configuration, is T2.

The first TFT (25) comprises a source electrode (22) and a drain electrode (23) in a first conducting layer (ML1). A gate electrode (24) resides in the second conducting layer (ML2). ML1 and ML2 are separated by one or more dielectric layers. In a 2T1C arrangement, source electrode (22) may be connected to a data line, and the gate electrode (24) may be connected to a select line.

A second TFT (29) comprises a source (26) and drain (27) electrode in the first conducting layer (ML1), and a gate (28) electrode in the second conducting layer (ML2). The drain electrode (23) of the first transistor (25) is connected to the gate electrode (28) of the second transistor (25) using a via between the conducting layers ML1 and ML2. The drain electrode (27) of the second transistor (29) is connected to a pixel electrode (30) in a fourth conducting layer (ML4) using a via between the conducting layers ML1 and ML4. Whilst the pixel electrode (30) is shown as being a separate, fourth conducting layer (ML4), the pixel electrode (30) can alternatively be located in the same layer as any of the other electrodes.

A first storage capacitance ($C_1$) results from the overlap of the second gate electrode (28) and the source electrode (26), which are separated by one or more dielectric or semiconducting layers. This is often desired, as a storage capacitance between the gate and source electrodes enables the voltage of the gate electrode to remain at the desired value.

The additional storage capacitance ($C_2$) is provided by the gate electrode (28) of the TFT (29) and an electrode or plate (31) in a third conducting layer (ML3). The electrode (31) acts as a plate of a capacitor, which is separated from the gate electrode (28), the other plate of the capacitor ($C_2$), by an undefined number of dielectric or semiconducting layers between ML2 and ML3.

In this configuration, the electrode (31) is above the gate electrode (28) and overlaps with the gate electrode (28). The electrode (31) and gate electrode (28) are capacitively coupled to provide $C_2$, which provides an additional capacitance to the gate electrode (28).

In this configuration, the electrode (31) is electrically connected to the source electrode (26) of the second TFT (29) by a via (32) extending between layers ML3 and ML1. As such, electrically, $C_2$ is in parallel with $C_1$ (since both capacitors are connected between the gate electrode (28) and the source electrode (26), and so adds additional capacitance to $C_1$.

Vias (32) may be placed (a) outside and/or (b) inside the active area of the display (40). This is shown schematically in FIGS. 4a and 4b respectively.

Figure 4A:
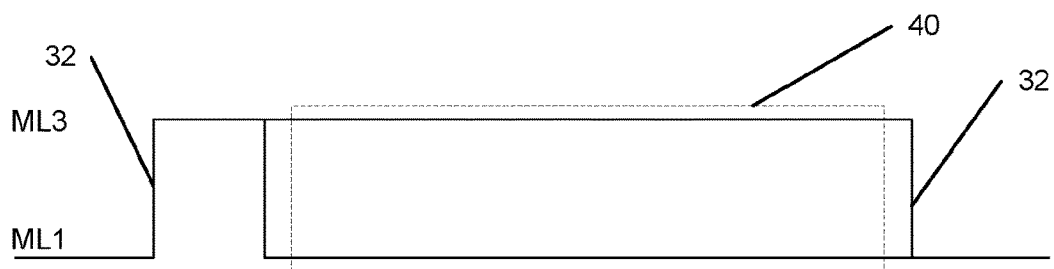
FIGS. 4a, 4b and 4c show different via connection configurations between layers ML1 and ML3.
Figure 4B:
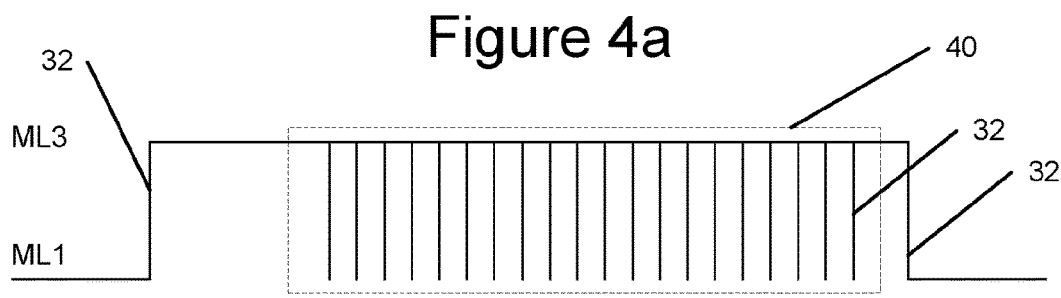

In FIG. 4a, the vias (32) are located outside of the display area (40) and all the source electrodes are connected together along ML1. In FIG. 4b, the vias (32) are located inside and outside of the display area (40) and the source electrodes are electrically isolated along ML1. In order to achieve a higher resolution, FIG. 4a is the preferred option.

The electrode (31) may cover the entire area of the display as a blanket, with holes for the top pixel vias to pass therethrough. This enables low resistivity, small voltage drop and improved display uniformity. It is preferable to reduce as much as possible the overlap between the electrode (31) and the gate electrode (24) of the switch TFT to speed up the signal connected to the gate electrode (24) of the switch TFT, especially for large displays.

Figure 1:
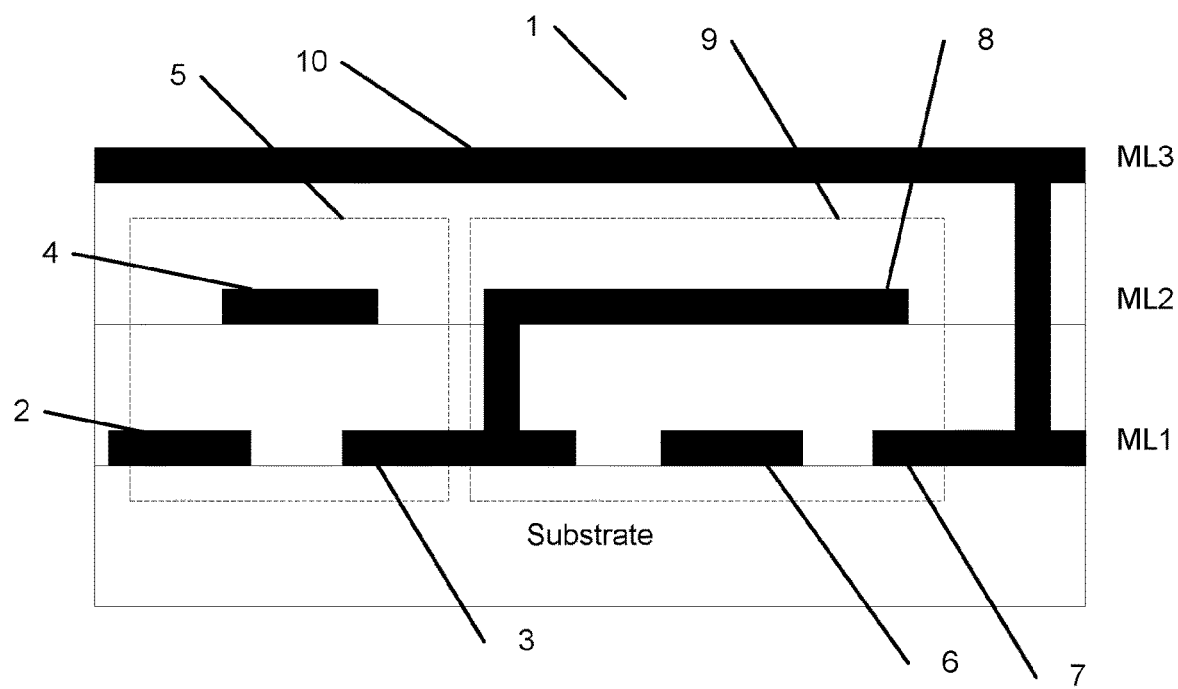
FIG. 1 shows a prior art control component in a top-gate configuration.
Figure 2:
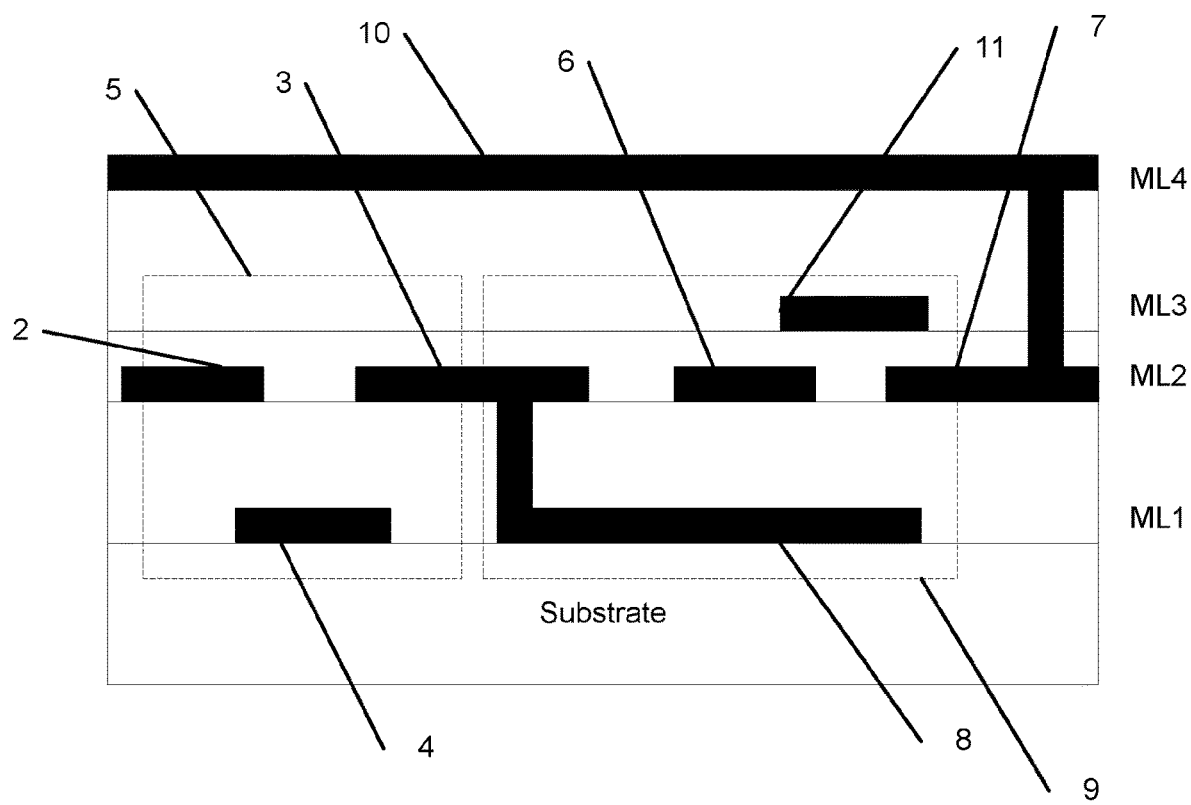
FIG. 2 shows a prior art control component in a bottom-gate configuration.
Figure 5:
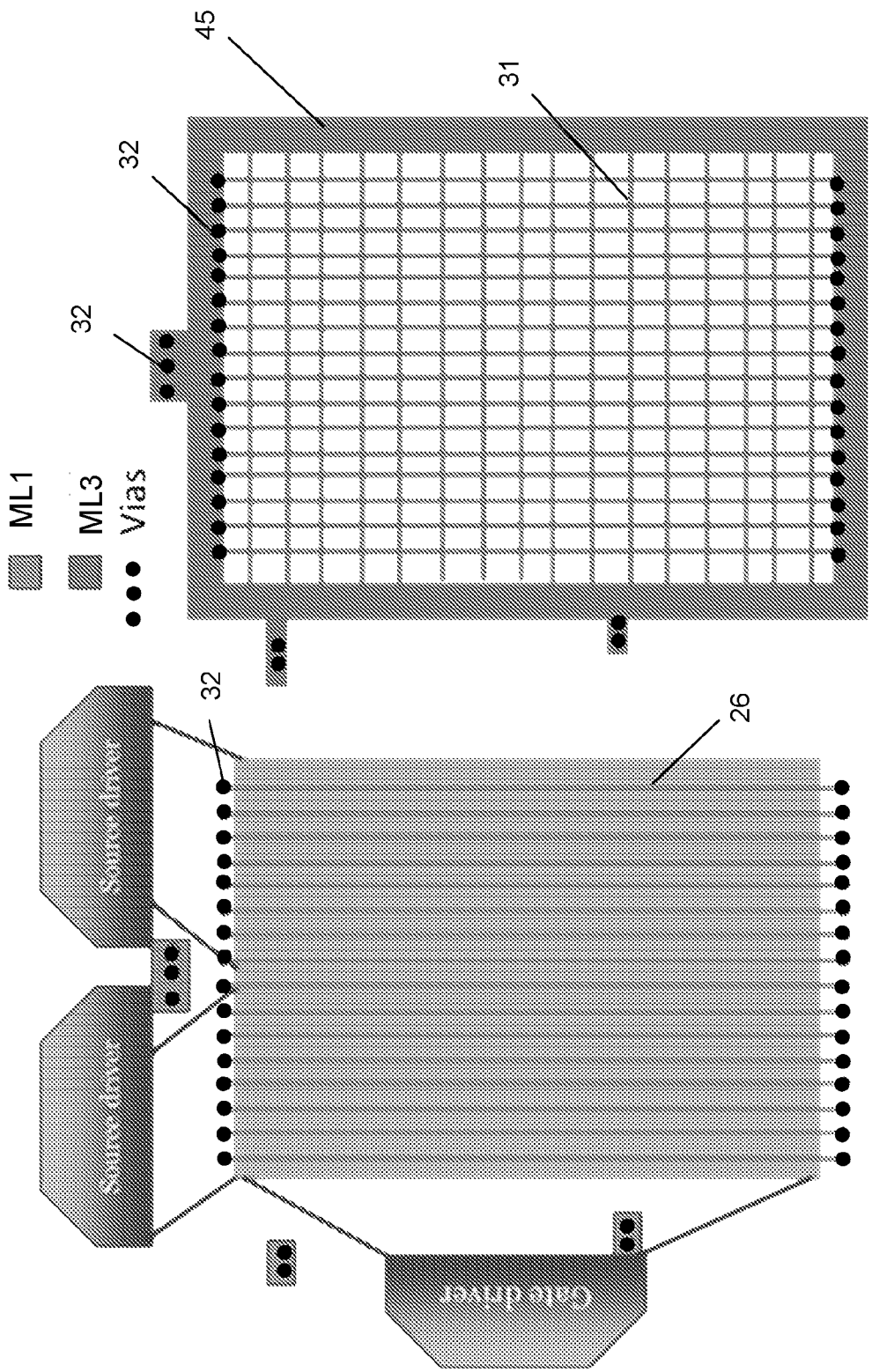
FIG. 5 shows a layout for layers ML1 and ML3.

FIG. 5 shows a possible layout of the ML1 and ML3 layers of the multiple layer electronic structure of FIG. 2, in combination with FIG. 4a. As such, the vias (32) are provided outside of the display area, with the electrode (31) is layer ML3 being provided as a grid pattern across the whole display, with narrow connections wherever capacitive coupling to other metal layers need to be reduced. The grid-like configuration is preferable to a striped configuration where the electrodes (31) run parallel to the data or select lines connected to the source (22) or gate electrodes (24) respectively. With bottom emission OLEDs, the grid preferably also provides an optical path for the light. Source and gate drivers are located around the periphery of the display, with various other vias carrying the source and gate current to the required layers.

In these configurations, it is noted that the OLED current does not flow through the electrode (31), i.e. only dynamic power is dissipated through the electrode (31).

Figure 6:
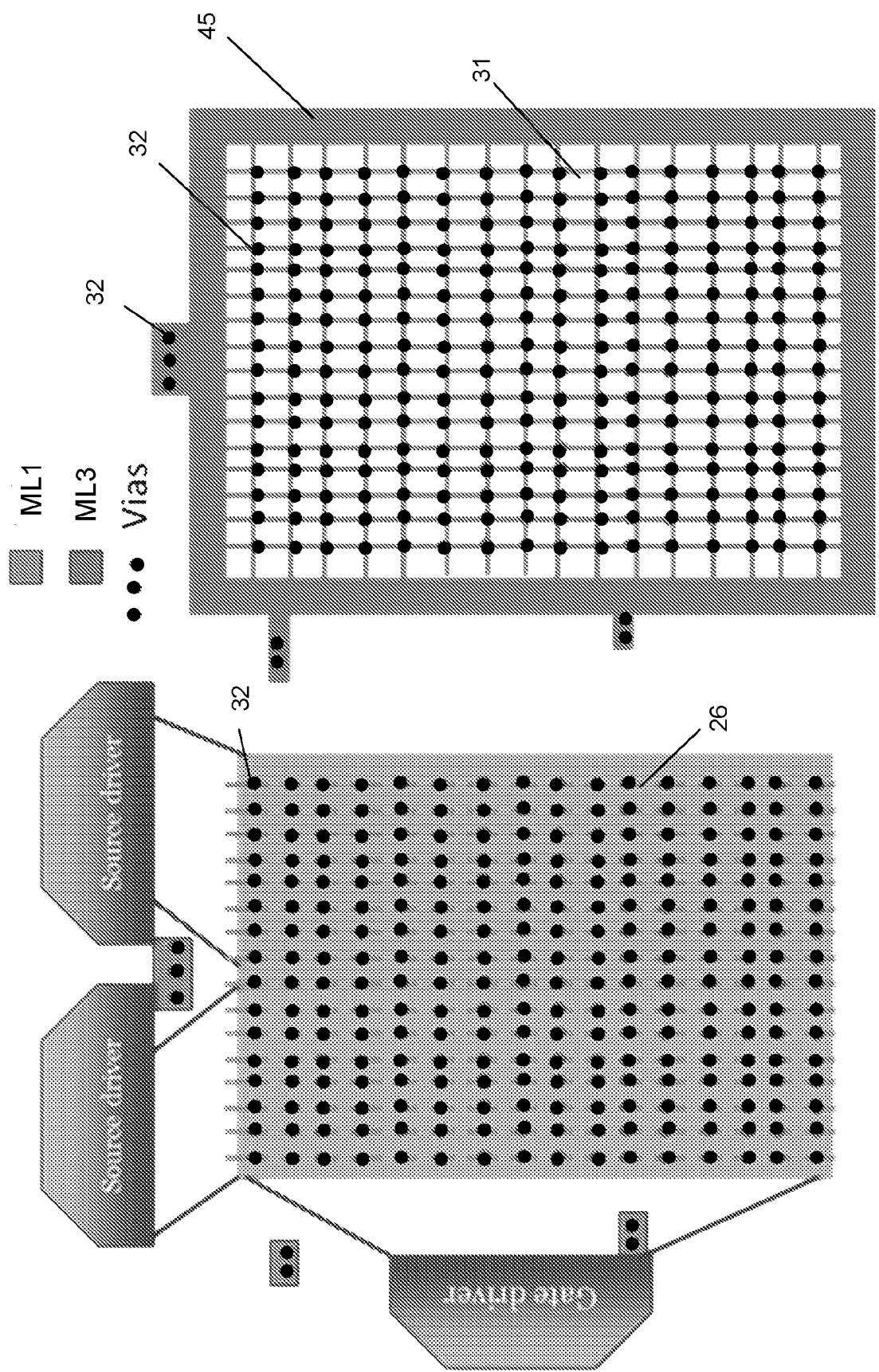
FIG. 6 shows an alternative layout for layers ML1 and ML3.

FIG. 6 is similar to that of FIG. 5, except that vias (32) are also provided within the display area (as with FIG. 4b). This is an alternative for saving space on ML1 and to achieve a higher resolution, although it comes with the cost of an additional via per pixel or per groups of pixels. This time, the source electrodes (26) are not constituted by lines routed parallel to the data line, but by islands connected to the electrode (31) by the on-pixel vias in FIG. 2. In this case, the OLED current does flow through the electrode (31).

For improved voltage and display uniformity, a connection bus (45) may be provided around the display area and vias may be located in multiple locations around the display, providing as many connections as possible to the required voltage supply.

Hybrid configurations between FIGS. 4a and 4b are possible, also enabling redundancy.

Figure 7:
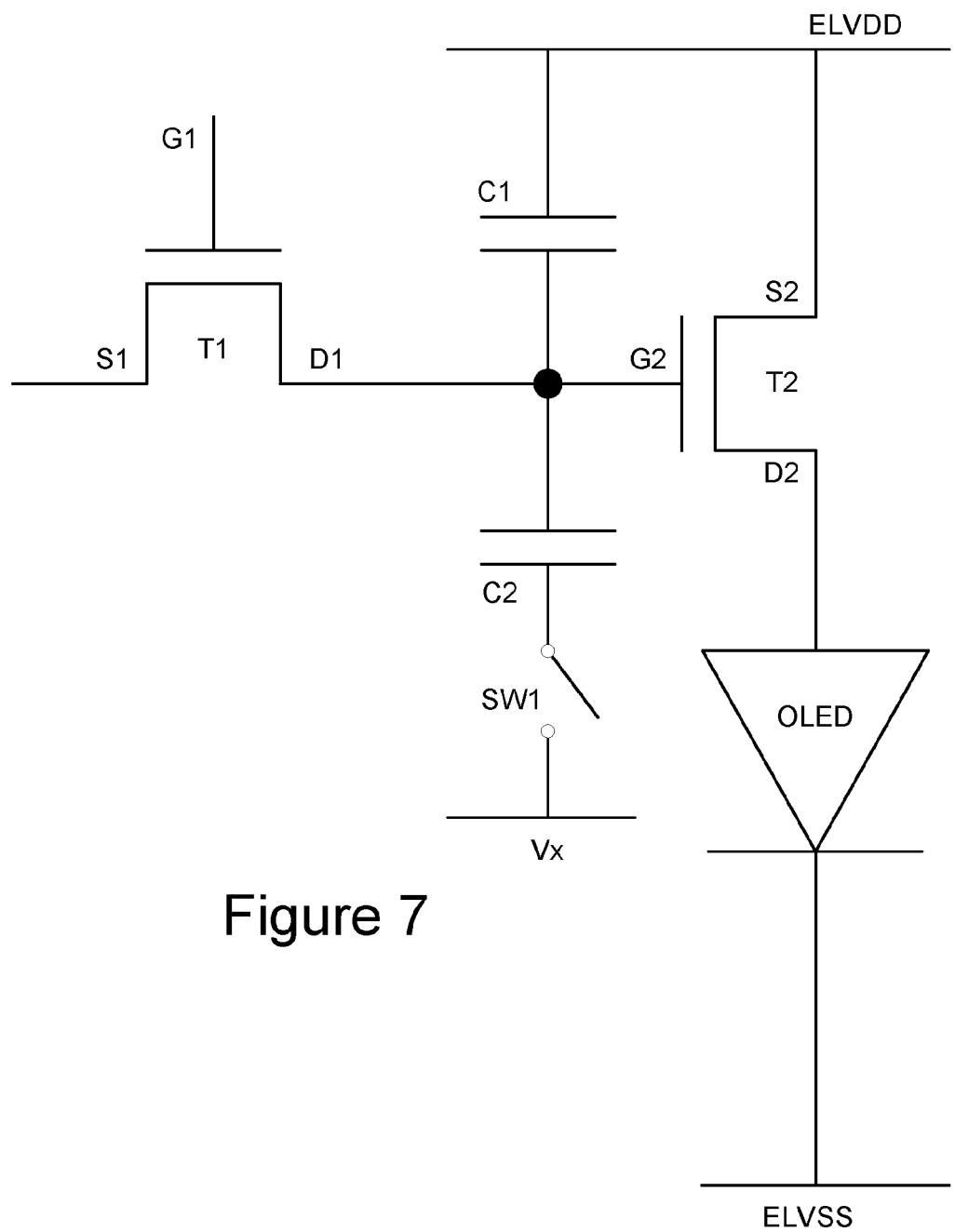
FIG. 7 shows a circuit diagram.

FIG. 7 shows a circuit view of one of the 2T1C pixels in a display, based on p-type TFTs. This circuit configuration is applicable to each of the embodiments described with reference to FIGS. 3 to 6 and 8 to 12. As can be seen, the gate (G2) of the second TFT (T2) has two storage capacitances ($C_1$ and $C_2$) connected to it. $C_1$ is defined between the gate (G2) and the source (S2), which is connected to the supply voltage (ELVDD). $C_2$, on the other hand, is connected to G2 and Vx. In this figure, Vx may represent a number of connection options.

With reference to FIG. 3, C2 is connected to the source electrode (S2). In combination with FIG. 5 or 6, a connection to the source electrode (S2) represents a connection to the supply voltage Vx=ELVDD. In this case, C1 and C2 are thus electrically in parallel with one another and the capacitance C2 adds to the capacitance C1.

In alternative embodiments (to be described in detail below), Vx may represent a connection to an alternative electrode with a constant supply voltage (ELVSS for example, or ground, or another supply voltage). Such connection may be achieved with an on-pixel via or an off-pixel via.

There may also be a switch TFT between gate and the constant voltage supply (shown as SW1 in FIG. 7), but the switch will be closed for most of the frame time so that C2 effectively contributes to keep the gate voltage at the desired value. In terms of the physical implementation of the switch in the structure, the third electrode providing additional capacitive coupling to the gate electrode can be connected to the other electrodes and/or voltage supplies via switch TFTs that are controlled either by the same select line as T1 or a separate select line. This provides additional flexibility to implement driving schemes that compensate the threshold voltage shift that characterizes many thin film transistor technologies. As discussed above, the circuit configuration shown in FIG. 7, with or without the switch SW1, is applicable to each of the embodiments described with reference to FIGS. 3 to 6 and 8 to 12.

In any of the above cases, where Vx is an alternative supply voltage to that connected to the source (S2) of T2, C2 still represents an additional capacitance to C1 on the gate (G2) of T2, and thus adds to the storage capacitance of T2.

Figure 8A:
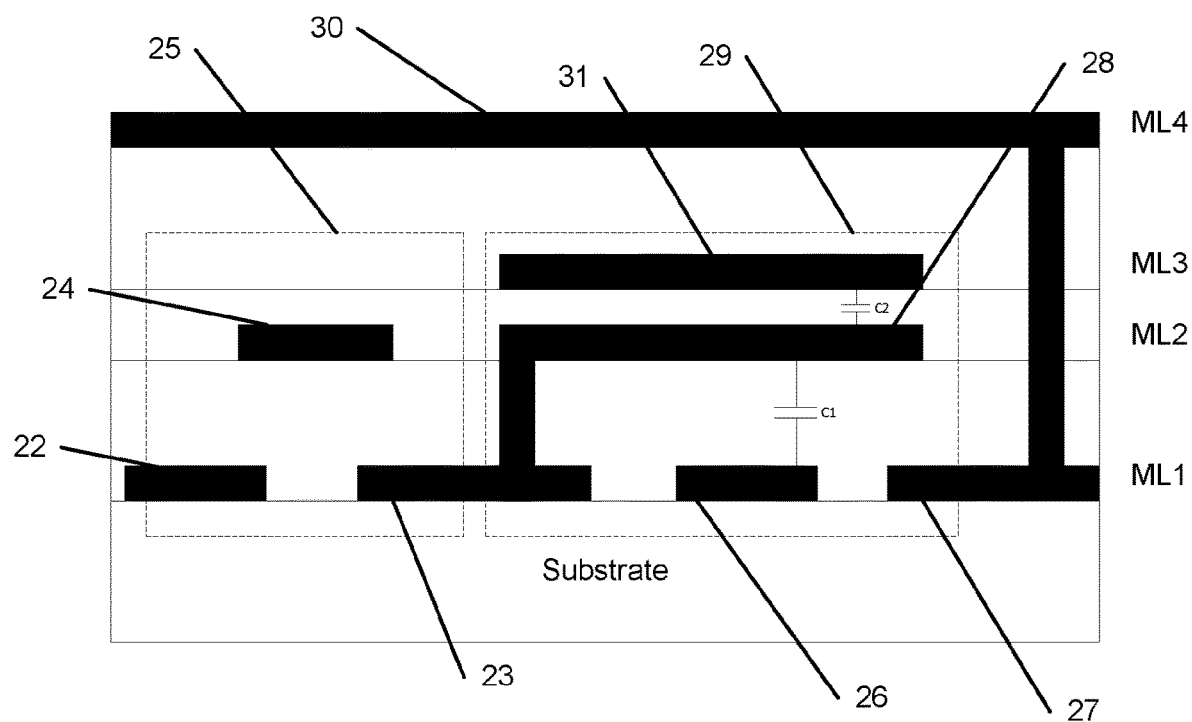
FIG. 8a shows an alternative top-gate configuration control component.

FIG. 8a shows an alternative top-gate configuration multiple layer electronic structure control component including Thin Film Transistors (TFTs) for driving a pixel electrode in a display (for example an AMOLED display). As with FIG. 3, only one pixel in a display is shown (the display comprising many pixels having the same arrangement). Whilst the figures show the TFTs in a 2T1C arrangement, the invention is not limited to 2T1C configurations. The invention more generally applied to drive transistors, which in the case of a 2T1C configuration, is T2.

The first TFT (25) comprises a source electrode (22) and a drain electrode (23) in a first conducting layer (ML1). A gate electrode (24) resides in the second conducting layer (ML2). ML1 and ML2 are separated by one or more dielectric layers. In a 2T1C arrangement, source electrode (22) may be connected to a data line, and the gate electrode (24) may be connected to a select line.

A second TFT (29) comprises a source (26) and drain (27) electrode in the first conducting layer (ML1), and a gate (28) electrode in the second conducting layer (ML2). The drain electrode (23) of the first transistor (25) is connected to the gate electrode (28) of the second transistor (25) using a via between the conducting layers ML1 and ML2. The drain electrode (27) of the second transistor (29) is connected to a pixel electrode (30) in a fourth conducting layer (ML4) using a via between the conducting layers ML1 and ML4. Whilst the pixel electrode (30) is shown as being a separate, fourth conducting layer (ML4), the pixel electrode (30) alternatively may be located in the same layer as any of the other electrodes.

A first storage capacitance ($C_1$) results from the overlap of the second gate electrode (28) and the source electrode (26), which are separated by one or more dielectric or semiconducting layers. This is often desired, as a storage capacitance between the gate and source electrodes enables the voltage of the gate electrode to remain at the desired value.

The additional storage capacitance ($C_2$) is provided by the gate electrode (28) of the TFT (29) and an electrode or plate (31) in a third conducting layer (ML3). The electrode (31) acts as a plate of a capacitor, which is separated from the gate electrode (28), the other plate of the capacitor ($C_2$), by a dielectric layer between ML2 and ML3.

In this configuration, the electrode (31) is above the gate electrode (28) and overlaps with the gate electrode (28). The electrode (31) and gate electrode (28) are capacitively coupled to provide $C_2$, which provides an additional capacitance to the gate electrode (28).

In this configuration, the electrode (31) is not connected to the source electrode (26) of the second TFT (29) (as shown in FIG. 3). Instead, the electrode may be connected to a different voltage source (ELVSS in FIG. 6, for example). Whilst $C_2$ will not be in parallel with $C_1$ (electrically), $C_2$ is still connected to the gate electrode (28) and still counts as an additional capacitance to the storage capacitance of the gate electrode.

Figure 8B:
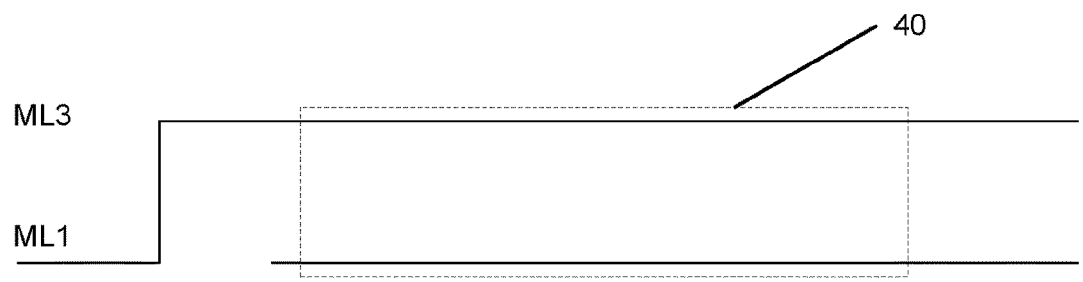

FIG. 8b shows a profile of such an arrangement. As can be seen, the structures on the conducting layers ML1 and ML3 are not connected together, but remain separate.

In this arrangement, an extension of the electrode (31) can be used to keep the semiconductor outside of the TFT channel area in off state. This is particularly useful to block the unwanted leakages when the semiconductor is not patterned to isolate TFTs. For this, the electrode (31) may be connected to a different voltage supply from the source electrode (26). The OLED current will only flow through the source electrode (26), while the electrode (31) will only serve as a counter electrode for the additional storage capacitor and to turn off parasitic leakages.

Figure 9:
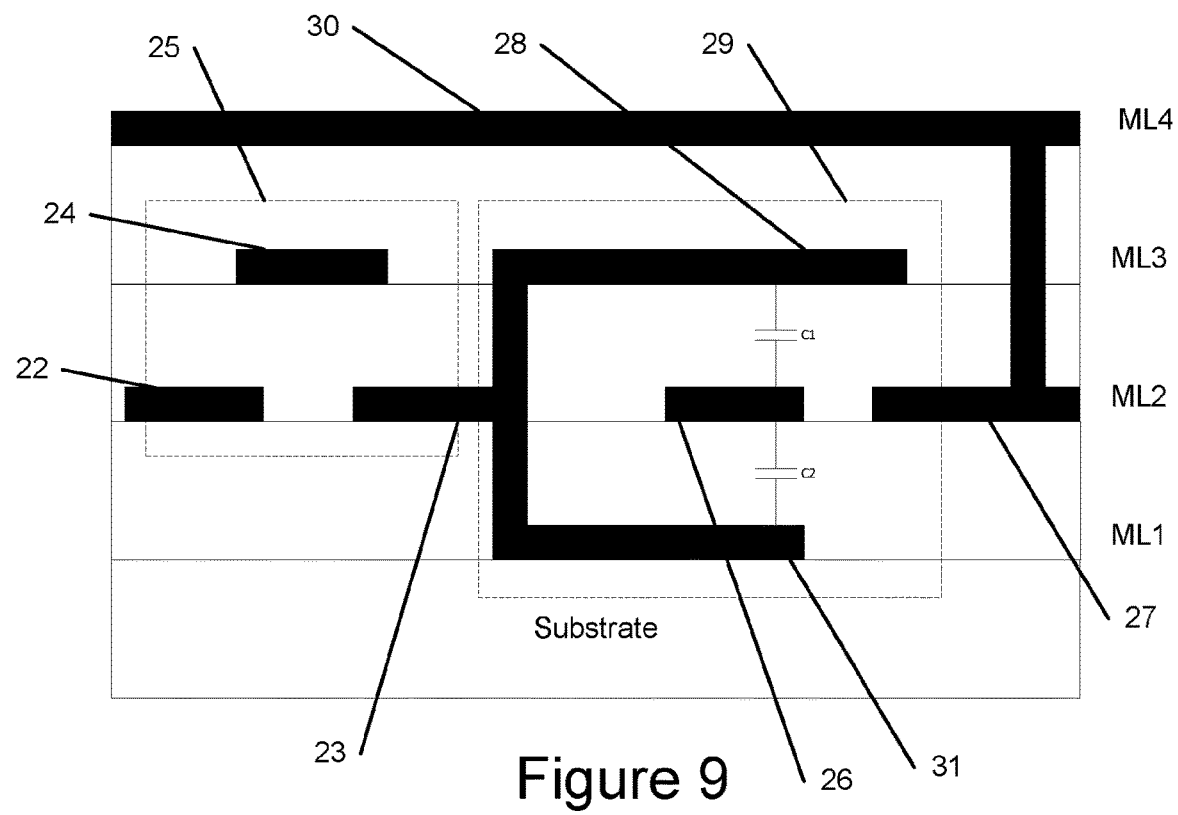
FIG. 9 shows an alternative top-gate configuration control component.

FIG. 9 shows an alternative top-gate configuration multiple layer electronic structure control component including Thin Film Transistors (TFTs) for driving a pixel electrode in a display (for example an AMOLED display). As with FIGS. 3 and 8a, only one pixel in a display is shown (the display comprising many pixels having the same arrangement). Whilst the figures show the TFTs in a 2T1C arrangement, the invention is not limited to 2T1C configurations.

The first TFT (25) comprises a source electrode (22) and a drain electrode (23) in a second conducting layer (ML2). A gate electrode (24) resides in the third conducting layer (ML3). ML2 and ML3 are separated by one or more dielectric layers. In a 2T1C arrangement, source electrode (22) may be connected to a data line, and the gate electrode (24) may be connected to a select line.

A second TFT (29) comprises a source (26) and drain (27) electrode in the second conducting layer (ML2), and a gate (28) electrode in the third conducting layer (ML3). The drain electrode (23) of the first transistor (25) is connected to the gate electrode (28) of the second transistor (25) using a via between the conducting layers ML2 and ML3. The drain electrode (27) of the second transistor (29) is connected to a pixel electrode (30) in a fourth conducting layer (ML4) using a via between the conducting layers ML2 and ML4. Whilst the pixel electrode (30) is shown as being a separate, fourth conducting layer (ML4), the pixel electrode (30) alternatively may be located in the same layer as any of the other electrodes.

A first storage capacitance ($C_1$) results from the overlap of the second gate electrode (28) and the source electrode (26), which are separated by one or more dielectric or semiconducting layers. This is often desired, as a storage capacitance between the gate and source electrodes enables the voltage of the gate electrode to remain at the desired value.

In this configuration the second storage capacitance ($C_2$) is provided by the source electrode (26) of the second TFT (29) and an electrode or plate (31) in a first conducting layer (ML1) underneath the second conducting layer (ML2), separated by one or more dielectric or semiconducting layers. The electrode (31) acts as a plate of the second capacitor. The electrode (31) is connected to the gate electrode (28) using a via between layers ML3 and ML1. When the electrode (31) extends to overlap with the channel area, it can also act as a light shield to the TFT or a double gate.

In this configuration, the electrode (31) is electrically connected to the gate electrode (28) and is coupled to the source electrode (26). Electrically, $C_2$ is in parallel with $C_1$ (since both are connected to the source (26) and gate (28) electrodes), and thus adds an additional capacitance to the storage capacitance of the gate electrode.

It is noted in the structure described above, the electrode (31) cannot have a grid-like pattern in this case, but will be formed by mutually disconnected islands, one for each pixel or subpixel.

Figure 10:
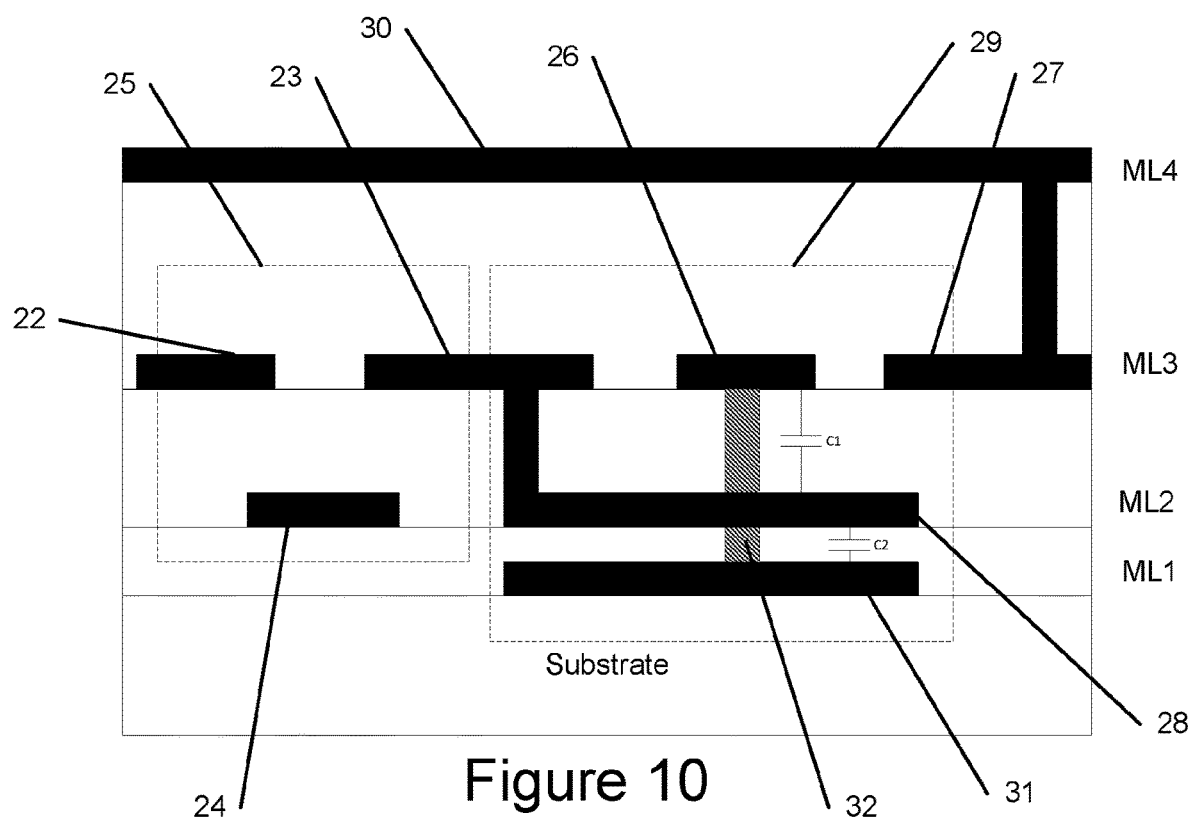
FIG. 10 shows a bottom-gate configuration control component.

FIG. 10 shows a bottom-gate configuration multiple layer electronic structure control component including Thin Film Transistors (TFTs) for driving a pixel electrode in a display (for example an AMOLED display). FIG. 10 only shows one pixel in a display which comprises many pixels having the same arrangement. Whilst the figures show the TFTs in a 2T1C arrangement, the invention is not limited to 2T1C configurations.

The first TFT (25) comprises a source electrode (22) and a drain electrode (23) in a third conducting layer (ML3). A gate electrode (24) resides in the second conducting layer (ML2). ML3 and ML2 are separated by one or more dielectric layers. In a 2T1C arrangement, source electrode (22) may be connected to a data line, and the gate electrode (24) may be connected to a select line.

A second TFT (29) comprises a source (26) and drain (27) electrode in the third conducting layer (ML3), and a gate (28) electrode in the second conducting layer (ML2). The drain electrode (23) of the first transistor (25) is connected to the gate electrode (28) of the second transistor (25) using a via between the conducting layers ML2 and ML3. The drain electrode (27) of the second transistor (29) is connected to a pixel electrode (30) in a fourth conducting layer (ML4) using a via between the conducting layers ML3 and ML4. Whilst the pixel electrode (30) is shown as being a separate, fourth conducting layer (ML4), the pixel electrode (30) alternatively may be located in the same layer as any of the other electrodes.

A first storage capacitance ($C_1$) results from the overlap of the second gate electrode (28) and the source electrode (26), which are separated by one or more dielectric or semiconducting layers. This is often desired, as a storage capacitance between the gate and source electrodes enables the voltage of the gate electrode to remain at the desired value.

A second storage capacitance ($C_2$) is provided by the gate electrode (28) of the second TFT (29) and an electrode or plate (31) in a first conducting layer (ML1). The electrode (31) acts as a plate of a capacitor, which is separated from the gate electrode (28), the other plate of the capacitor ($C_2$), by one or more dielectric or semiconducting layers between ML1 and ML2.

In this configuration, the electrode (31) is below the gate electrode (28) and overlaps with the gate electrode (28). The electrode (31) and gate electrode (28) are capacitively coupled to provide $C_2$, which provides an additional capacitance to the gate electrode (28).

In this configuration, the electrode (31) is electrically connected to the source electrode (26) of the second TFT (29) by a via (32) extending between layers ML1 and ML3. As such, electrically, $C_2$ is in parallel with $C_1$ (since both capacitors are connected between the gate electrode (28) and the source electrode (26), and so adds additional capacitance to $C_1$.

Figure 4C:
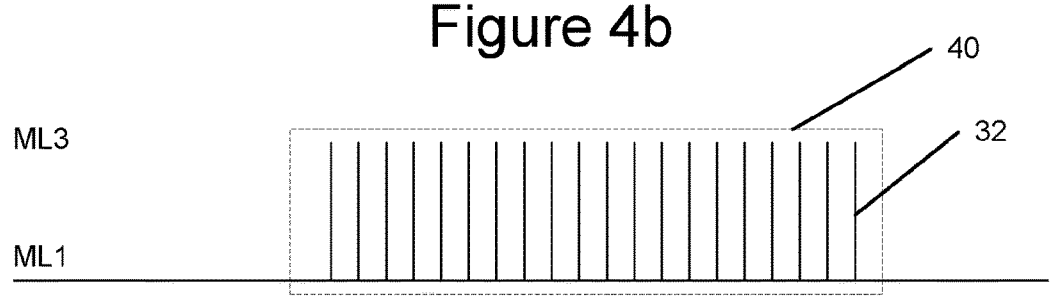

As with the top-gate configuration discussed in FIG. 3, vias (32) may be placed (a) outside and/or (b) inside the active area of the display. This is shown schematically in FIGS. 4a and 4c respectively. In FIG. 4c, the source electrodes are electrically isolated along ML3. The same discussion regarding these figures applies here also.

As with the earlier configurations (with reference to FIGS. 3, 4, 5 and 6), the electrode (31) may cover the entire area of the display as a blanket formed as a grid (see FIGS. 5 and 6). This enables low resistivity, small voltage drop and improved display uniformity. It is preferable to reduce as much as possible the overlap between the electrode (31) and the gate electrode (24) to speed up the signal connected to the gate electrode (24), especially for large displays.

Figure 11:
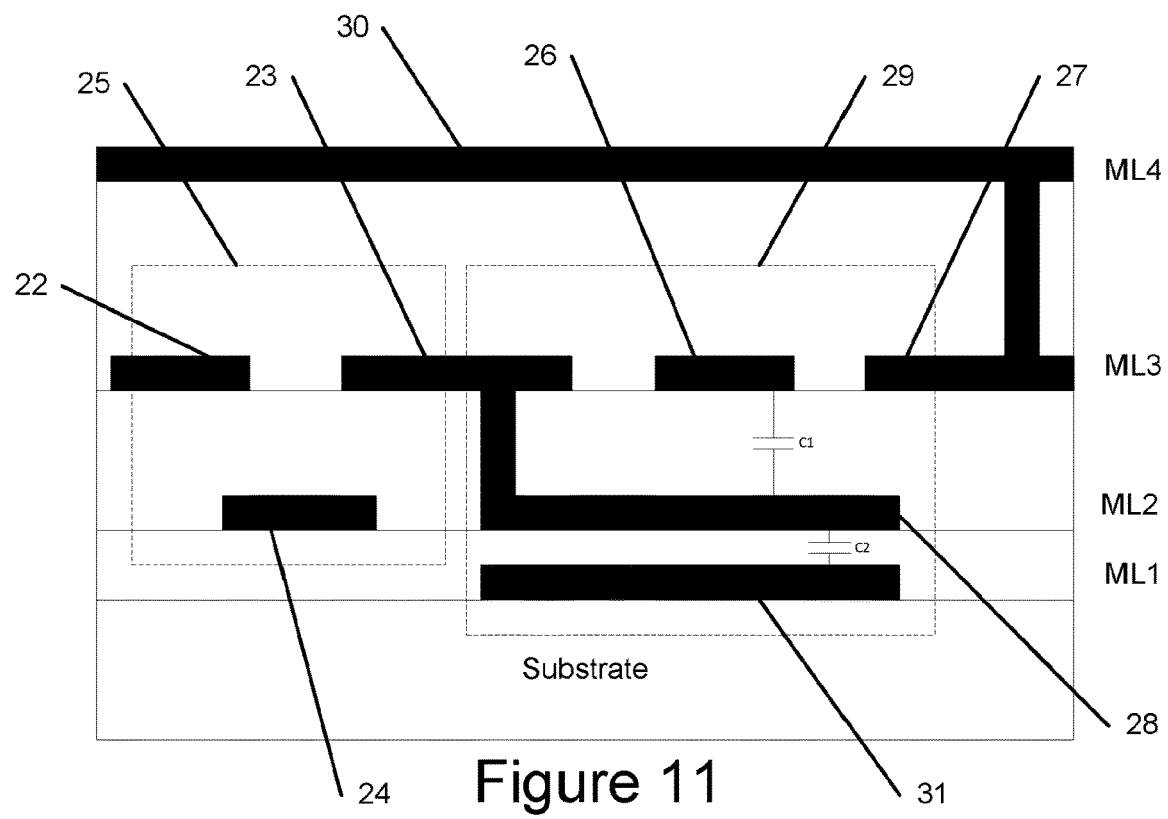
FIG. 11 shows an alternative bottom-gate configuration control component.

FIG. 11 shows an alternative bottom-gate configuration multiple layer electronic structure control component including Thin Film Transistors (TFTs) for driving a pixel electrode in a display (for example an AMOLED display). As with FIG. 10, only one pixel in a display is shown (the display comprising many pixels having the same arrangement). Whilst the figures show the TFTs in a 2T1C arrangement, the invention is not limited to 2T1C configurations.

The first TFT (25) comprises a source electrode (22) and a drain electrode (23) in a third conducting layer (ML3). A gate electrode (24) resides in the second conducting layer (ML2). ML3 and ML2 are separated by one or more dielectric layers. In a 2T1C arrangement, source electrode (22) may be connected to a data line, and the gate electrode (24) may be connected to a select line.

A second TFT (29) comprises a source (26) and drain (27) electrode in the third conducting layer (ML3), and a gate (28) electrode in the second conducting layer (ML2). The drain electrode (23) of the first transistor (25) is connected to the gate electrode (28) of the second transistor (25) using a via between the conducting layers ML3 and ML2. The drain electrode (27) of the second transistor (29) is connected to a pixel electrode (30) in a fourth conducting layer (ML4) using a via between the conducting layers ML3 and ML4. Whilst the pixel electrode (30) is shown as being a separate, fourth conducting layer (ML4), the pixel electrode (30) alternatively may be located in the same layer as any of the other electrodes.

A first storage capacitance ($C_1$) results from the overlap of the second gate electrode (28) and the source electrode (26), which are separated by one or more dielectric or semiconducting layers. This is often desired, as a storage capacitance between the gate and source electrodes enables the voltage of the gate electrode to remain at the desired value.

A second storage capacitance ($C_2$) is provided by the gate electrode (28) of the second TFT (29) and an electrode or plate (31) in a first conducting layer (ML1). The electrode (31) acts as a plate of a capacitor, which is separated from the gate electrode (28), the other plate of the capacitor ($C_2$), by one or more dielectric or semiconducting layers between ML1 and ML2.

In this configuration, the electrode (31) is below the gate electrode (28) and overlaps with the gate electrode (28). The electrode (31) and gate electrode (28) are capacitively coupled to provide $C_2$, which provides an additional capacitance to the gate electrode (28).

In this configuration, the electrode (31) is not connected to the source electrode (26) of the second TFT (29) (as shown in FIG. 10). Instead, the electrode may be connected to a different voltage source (ELVSS in FIG. 7, for example. Whilst $C_2$ will not be in parallel with $C_1$ (electrically), $C_2$ is still connected to the gate electrode (28) and still counts as an additional capacitance to the storage capacitance of the gate electrode.

In this arrangement, an extension of the electrode (31) can be used to keep the semiconductor outside of the TFT channel area in off state. This is particularly useful to block the unwanted leakages when the semiconductor is not patterned to isolate TFTs. For this, the electrode (31) may be connected to a different voltage supply from the source electrode (26). The OLED current will only flow through the source electrode (26), while the electrode (31) will only serve as a counter electrode for the additional storage capacitor and to turn off parasitic leakages.

Figure 12:
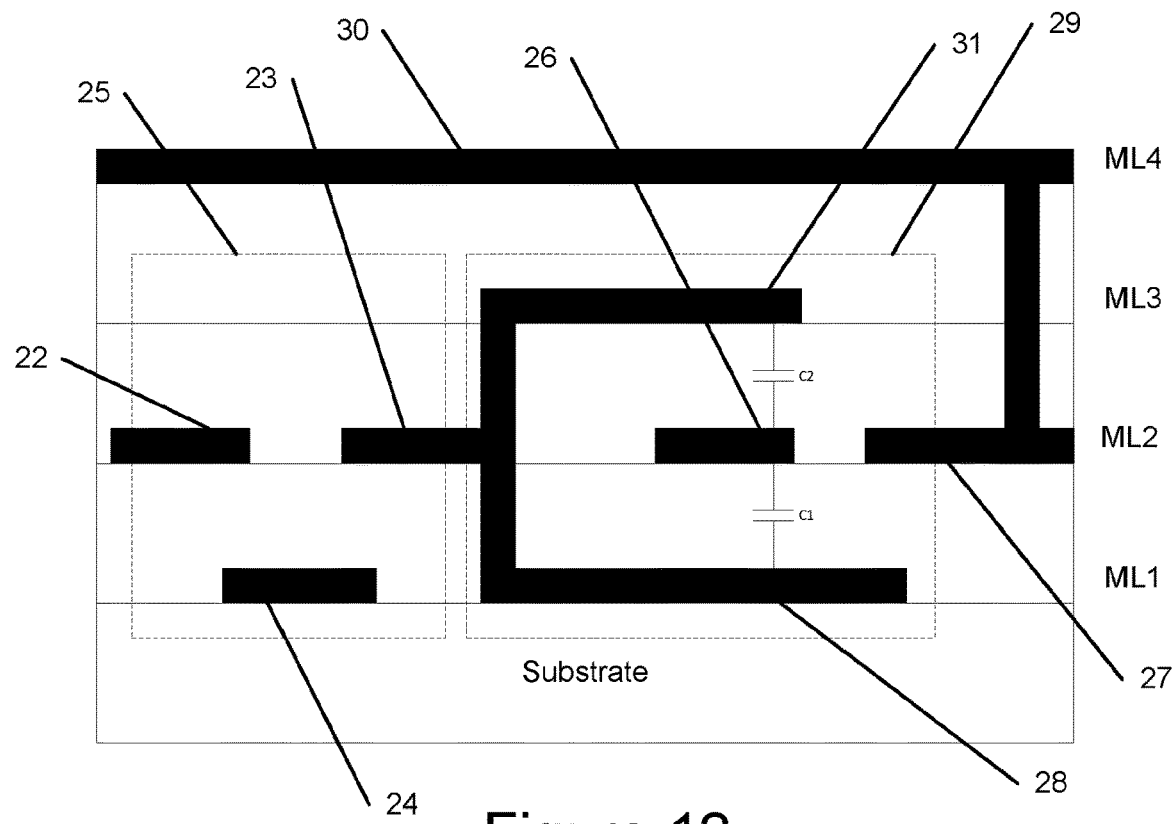
FIG. 12 shows an alternative bottom-gate configuration control component.

FIG. 12 shows an alternative bottom-gate configuration multiple layer electronic structure control component including Thin Film Transistors (TFTs) for driving a pixel electrode in a display (for example an AMOLED display). As with FIGS. 10 and 11, only one pixel in a display is shown (the display comprising many pixels having the same arrangement). Whilst the figures show the TFTs in a 2T1C arrangement, the invention is not limited to 2T1C configurations.

The first TFT (25) comprises a source electrode (22) and a drain electrode (23) in a second conducting layer (ML2). A gate electrode (24) resides in the first conducting layer (ML1). ML1 and ML2 are separated by one or more dielectric layers. In a 2T1C arrangement, source electrode (22) may be connected to a data line, and the gate electrode (24) may be connected to a select line.

A second TFT (29) comprises a source (26) and drain (27) electrode in the second conducting layer (ML2), and a gate (28) electrode in the first conducting layer (ML1). The drain electrode (23) of the first transistor (25) is connected to the gate electrode (28) of the second transistor (25) using a via between the conducting layers ML1 and ML2. The drain electrode (27) of the second transistor (29) is connected to a pixel electrode (30) in a fourth conducting layer (ML4) using a via between the conducting layers ML2 and ML4. Whilst the pixel electrode (30) is shown as being a separate, fourth conducting layer (ML4), the pixel electrode (30) alternatively may be located in the same layer as any of the other electrodes.

A first storage capacitance ($C_1$) results from the overlap of the second gate electrode (28) and the source electrode (26), which are separated by one or more dielectric or semiconducting layers. This is often desired, as a storage capacitance between the gate and source electrodes enables the voltage of the gate electrode to remain at the desired value.

In this configuration the second storage capacitance ($C_2$) is provided by the source electrode (26) of the second TFT (29) and an electrode or plate (31) in a third conducting layer (ML3) above the second conducting layer (ML2), separated by one or more dielectric or semiconducting layers. The electrode (31) acts as a plate of the second capacitor. The electrode (31 is connected to the gate electrode (28) using a via between layers ML3 and ML1. When the electrode (31) extends to overlap with the channel area, it can also act as a light shield to the TFT or a double gate.

In this configuration, the electrode (31) is electrically connected to the gate electrode (28) and is coupled to the source electrode (26). Electrically, $C_2$ is in parallel with $C_1$ (since both are connected to the source (26) and gate (28) electrodes), and thus adds an additional capacitance to the storage capacitance of the gate electrode.

It is noted in the structure described above, the electrode (31) cannot have a grid-like pattern in this case, but will be formed by mutually disconnected islands, one for each pixel or subpixel.

In any of the configurations described above, it is noted that, in order to minimise the coupling of the electrode (31) to the pixel electrode (30), the top pixel dielectric (i.e. the dielectric layer between the electrode (31) and the pixel electrode (30)) can be made as thick as required. Typically, the dielectric thickness is in the region of 3 μm. Reducing the coupling between the electrode (31) and pixel electrode (30) reduces the parasitic capacitances on the pixel electrode.

Furthermore, the figures suggest that the dielectric and semiconducting layers extend to cover the whole pixel. This does not need to be the case.

Further still, in some configurations, the electrode (31) may extend beyond the gate electrode (28) in its respective conductive layer, but preferably not extending under or over the first gate electrode (24) in order to reduce the possibility of coupling between the electrode (31) and the first gate electrode (24).

In each of the above embodiments, the semiconducting layer has been considered to be between the gate metal layer and the source-drain metal layer, but this doesn't have to be the case. The semiconducting layer may also be located adjacent to the source-drain contacts but on the other side compared to the gate metal.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A control component for controlling a current-driven optical media, the control component comprising a thin film transistor (TFT) for driving a pixel of an active matrix optoelectronic device, the control component comprising:
a substrate bearing a plurality of conducting layers, each being separated by respective dielectric and/or semiconducting layers, to define a plurality of TFTs and plurality of pixel electrodes, each of the plurality of pixel electrodes being electrically connected to at least one of the plurality of TFTs; wherein each TFT comprises:
first and second ones of the conducting layers defining source/drain electrodes of the TFT and a gate electrode of the TFT, the source/drain and gate electrodes being arranged such that a first storage capacitor ($C_1$) results from the overlap of the source and gate electrode within the TFT, and the drain electrode is connected to a respective pixel electrode;
third one of the conducting layers arranged to more strongly capacitively couple to the source or gate electrode than the pixel electrode or a semiconductor channel,
wherein a first plate of a second capacitor ($C_2$) is defined by the third one of the conducting layers within the TFT, and a second plate of the second capacitor ($C_2$) is defined by the gate electrode or the source electrode, the second capacitor ($C_2$) providing an additional storage capacitance to the gate electrode,
wherein the first storage capacitor and second storage capacitor are electrically connected in parallel, wherein current for the current-driven optical media does not flow through the first plate, and wherein dynamic power is dissipated via the first plate.

2. A control component according to claim 1, wherein the TFT is a top gate configuration TFT, wherein the source/drain electrodes are in the first one of the conducting layers, and wherein the gate electrode is in the second conducting layer which is a layer above the first layer separated by a dielectric layer.

3. A control component according to claim 2, wherein the second plate of the second capacitor is defined by the gate electrode, wherein the third conducting layer is above the second conducting layer and separated by a dielectric layer, and wherein the first plate of the second capacitor in the third conducting layer is above the gate electrode to define the second capacitor coupled to the gate electrode.

4. A control component according to claim 3, wherein the first plate of the second capacitor is connected to the source electrode by a via.

5. A control component according to claim 4, wherein the via between the first plate of the second capacitor and the source electrode is located outside of an area comprising the plurality of pixel electrodes.

6. A control component according to claim 4, wherein the via between the first plate of the second capacitor and the source electrode is located within the structure of the TFT.

7. A control component according to claim 3, wherein the first plate of the second capacitor is connected to a secondary voltage source,
wherein the control component optionally comprises a controllable switching element between the first plate of the second capacitor and the secondary voltage source, the controllable switching element being arranged to controllably connect the first plate to the secondary voltage source or disconnect the first plate from the secondary voltage source.

8. A control component according to claim 4, wherein the third conducting layer comprises a plurality of first plates of the second capacitors, one for each TFT, and wherein the plurality of first plates of the second capacitors are arranged as an interconnected grid over the width and length of the first and second layers of the plurality of TFTs, and wherein the holes in the grid are arranged to permit vias to pass therethrough from layers below the third layer to layers above the third layer, and optionally wherein a connection bus is provided outside of an area comprising the plurality of pixel electrodes, and wherein the plurality of first plates of the second capacitors are connected to the connection bus.

9. A control component according to claim 2, wherein the second plate of the second capacitor is defined by the source electrode, wherein the third conducting layer is a layer below the first conducting layer and separated by a dielectric layer, wherein the first plate of the second capacitor in the third conducting layer is disposed below the source electrode and is connected to the gate electrode to define the second capacitor coupled to the gate electrode, and optionally wherein the first plate of the second capacitor is connected to the gate electrode by a via.

10. A control component according to claim 1, wherein the TFT is a bottom gate configuration TFT, wherein the gate electrode is in the first one of the conducting layers, wherein the source/drain electrodes are in the second conducting layer which is a layer above the first layer separated by a dielectric layer.

11. A control component according to claim 10, wherein the second plate of the second capacitor is defined by the gate electrode, wherein the third conducting layer is below the first conducting layer and separated by a dielectric layer, and wherein the first plate of the second capacitor in the third conducting layer is below the gate electrode to define the second capacitor coupled to the gate electrode.

12. A control component according to claim 11, wherein the first plate of the second capacitor is connected to the source electrode by a via.

13. A control component according to claim 12, comprising a controllable switching element between the first plate of the second capacitor and the source electrode, the controllable switching element being arranged to controllably connect the first plate to the source or disconnect the first plate from the source.

14. A control component according to claim 12, wherein either:
the via between the second plate of the capacitor and the source electrode is located outside of an area comprising the plurality of pixel electrodes; and/or
the via between the second plate of the capacitor and the source electrode is located within the structure of the TFT.

15. A control component according to claim 11, wherein the first plate of the second capacitor is connected to a secondary voltage source,
wherein the control component optionally comprises a controllable switching element between the first plate of the second capacitor and the secondary voltage source, the controllable switching element being arranged to controllably connect the first plate to the secondary voltage source or disconnect the first plate from the secondary voltage source.

16. A control component according to claim 12, wherein the third conducting layer comprises a plurality of first plates of the second capacitors, one for each TFT, and wherein the plurality of first plates of the second capacitors are arranged as an interconnected grid over the width and length of the first and second layers of the plurality of TFTs.

17. A control component according to claim 16, wherein a connection bus is provided outside of an area comprising the plurality of pixel electrodes, and wherein the plurality of first plates of the second capacitors are connected to the connection bus.

18. A control component according to claim 10, wherein the second plate of the second capacitor is defined by the source electrode, wherein the third conducting layer is a layer above the second conducting layer and separated by a dielectric layer, wherein the first plate of the second capacitor in the third conducting layer is disposed above the source electrode and is connected to the gate electrode to define the second capacitor coupled to the gate electrode, and optionally wherein the first plate of the second capacitor is connected to the gate electrode by a via.

19. A control component according to claim 1, wherein each of the plurality of TFTs is connected to a respective second TFT, wherein a drain of the second TFT is connected to the gate electrode of the TFT such that each of the TFT and second TFT are in a 2T1C configuration for driving the pixel electrode.

20. An array of control components according to claim 1, wherein the source electrodes are electrically isolated along the first conducting layer.

21. An array of control components according to claim 1, wherein the first plate of the second capacitor is separated from the gate electrode and wherein the first plate and the gate electrode are capacitively coupled.

* * * * *